United States Patent [19]

Sueoka et al.

[11] 4,092,703
[45] May 30, 1978

[54] GATE CONTROLLED SEMICONDUCTOR DEVICE

[75] Inventors: Tetsuro Sueoka, Tokyo; Satoshi Ishibashi, Higashimine, both of Japan

[73] Assignee: Kabushiki Kaisha Meidensha, Tokyo, Japan

[21] Appl. No.: 777,844

[22] Filed: Mar. 15, 1977

[51] Int. Cl.² .............................. H01L 29/74
[52] U.S. Cl. ...................... 357/38; 357/20; 357/51; 357/68; 357/86
[58] Field of Search ............. 357/38, 20, 86, 68, 357/51

[56] References Cited

U.S. PATENT DOCUMENTS

| | | | |
|---|---|---|---|
| 3,489,962 | 1/1970 | McIntyre et al. | 357/38 |
| 3,586,927 | 6/1971 | Roach et al. | 353/38 |
| 3,609,476 | 9/1971 | Storm | 357/38 |
| 3,968,512 | 7/1976 | Voss | 357/38 |

OTHER PUBLICATIONS

E. Wolley et al., "Characteristics of a 200 AMP Gate Turn–Off Thyristor," IEEE Conf. Record of 1973 Meeting, 73 CHO763-31A, Oct. 8, 1973, pp. 251-255.
H. Storm et al., "An Involute Gate-Emitter Configuration for Thyristors and Transistors," 1973 Int. Elect. Dev. Meeting Tech. Digest, Wash., D.C., Dec. 3, 1973, pp. 113-115.

Primary Examiner—Stanley D. Miller, Jr.
Assistant Examiner—Joseph E. Clawson, Jr.
Attorney, Agent, or Firm—Haseltine, Lake & Waters

[57] ABSTRACT

A gate controlled semiconductor device in which a gate electrode is substantially divided into many pieces. The semiconductor device comprises a semiconductive element having at least one P-N junction formed by at least a pair of P-type diffusion regions and N-type diffusion regions, a plurality of cathode assemblies including a metallic layer deposited on a cathode-emitter layer formed on a surface of said semiconductive element, an anode electrode assembly and gate electrode assemblies. The latter includes a plurality of separated metallic layers provided around the cathode electrode assemblies of the cathode-emitter layer. The cathode electrode assemblies are of a radial and spiral shape and the divided gate electrode assemblies have also a ring shape and/or circular shape.

16 Claims, 17 Drawing Figures

GATE CONTROLLED SEMICONDUCTOR DEVICE

BACKGROUND OF THE INVENTION

The present invention relates to a semiconductor device, and more particularly to a gate controlled semiconductor device which is turned on and off by applying a gate control signal thereto.

A gate control semiconductor device such as, for example, a gate turn-off thyristor is constructed similar to a usual reverse-blocking three-terminal thyristor. The gate turn-off thyristor is transmitted from a conductive state to a non-conductive state by supplying the current to a gate electrode thereof, and thereby the main current flows into the gate turn-off thyristor. In order to change the thyristor to the non-conductive state from the conductive state, the main current must be made zero during some predetermined interval by some external means. The gate turn-off thyristor may be returned to the non-conductive state from the conductive state by supplying the negative current, which is the current flowing in the reverse direction for reverse-biasing a cathode junction. A ratio of a value of the reverse current and that of the main current (a load current) which is turned off by the reverse current, is called a turned-off gain ($g = Ica/Igr$), where $Ica$ is the main current of the turn-off thyristor, and $Igr$ is the reverse current. In order to increase the turn-off gain of the gate turn-off thyristor, it is necessary to make the base width larger and/or to make a gold diffusion condition stronger. The more important thing is the configuration of a cathode electrode which is required to make a transverse resistance between a cathode electrode and a gate electrode, as small as possible, in order to sweep effectively the current of the cathode.

In the conventional gate turn-off thyristor, the current mu-factor is restricted to lower values than that of the usual thyristor in order to increase the current interrupting capability due to the gate electrode. Furthermore, the gate turn-off thyristor is designed in shape so that the cathode electrode is located as near the gate electrode as possible, in order to eliminate the inner impedance between the cathode electrode and the gate electrode. Accordingly, the cathode electrode is divided into many small pieces and, as a result, the length of opposing faces of the cathode electrode and the gate electrode become inevitably long and, in particular, the cathode junction of a large capacity gate turn off thyristor is divided into a larger number of small pieces. Accordingly, in a gate turn-off thyristor constructed above, the gating current is more than ten times and/or even one hundred times that of the usual power thyristor.

In general, the gate turn off thyristor is often used to an inverter apparatus and a chopper apparatus, when a motor is used as a load of the apparatus employing the gate turn-off thyristor, the gating current must be supplied continuously to the gate electrode of the gate turn-off thyristor for both a conductive interval and a nonconductive interval. This requision is more serious in the gate turn-off thyristor than the usual thyristor. In the gate turn-off thyristor, the main current is interrupted due to the change of the load current even when the gate turn-off thyristor has been turned on, and then holds the current by a part of the cathode assembly. In this case, a long time interval is required to expand the conduction area since the cathode electrode is formed by the many pieces, therefore the current density becomes large in a part of the cathode electrode. Under these conditions, when the gate turn-off thyristor is turned off, the off operation of the gate turn-off thyristor is decreased, while the gate turn-off thyristor is destroyed permanently. Particularly, in the gate turn-off thyristor having (many) separated emitter-cathode, only. A part of the cathode holds the current and the conductive area does not expand to other separated emitters, and as a result the gate turn-off thyristor is destroyed.

In this manner, the gate turn-off thyristor requires not only many times the gating current, than the usual current in firing, but another requirement is to supply the large gating current for the conduction interval. On the other hand, to improve the gating sensitivity a thyristor having an amplificating function is proposed. The amplificating function, however, operates only when the thyristor is fired. Consequently, it is strongly requested to improve the gating sensitivity of the gate turn-off thyristor.

SUMMARY OF THE INVENTION

Accordingly, an object of the invention is to provide a high performance gate controlled semiconductor device in which an ON sensitivity is improved by dividing a gate electrode into many pieces, to be located around a cathode-emitter layer and by using one of the gate electrodes for making the device to turn ON.

Another object of the invention is to provide a high performance gate controlled semiconductor device in which the necessary gate current to fire the device is eliminated, without decreasing the characteristics in turning OFF.

When the above in view, the present invention resides in that a gate controlled semiconductor device comprises a semiconductive element having at least one P-N junction formed by at least a pair of P-type diffusion region and N-type diffusion region, a cathode assembly including a metallic layer deposited on a cathode-emitter layer formed on a surface of the semiconductive element, an anode electrode assembly and gate electrode assemblies which include a plural separated metallic layers provided around the cathode electrode assembly of the cathode-emitter layer.

A variety of embodiments will be described hereinafter including ones in which diode layers and an auxiliary thyristor are integrated.

BRIEF DESCRIPTION OF THE DRAWINGS

The invention will be described more fully with reference to the drawing in which.

DESCRIPTION OF THE PREFERRED EMBODIMENTS

Figure 1:
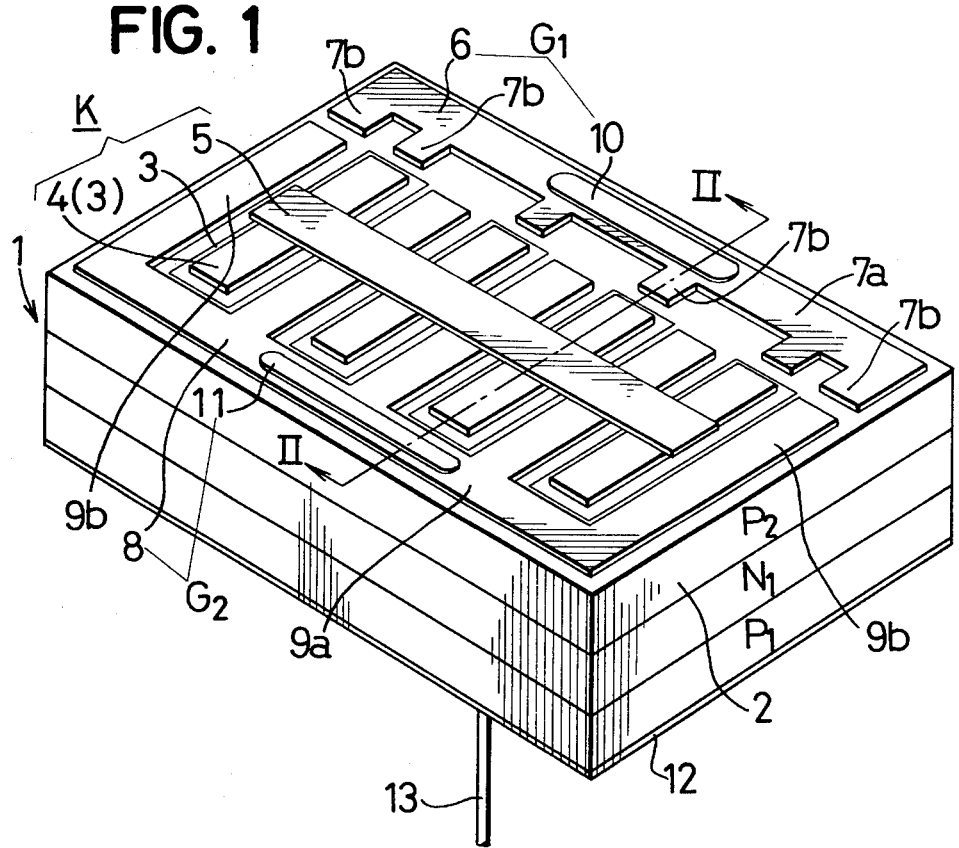
FIG. 1 is an enlarged schematic perspective view of a gate controlled semiconductor device employed in the present invention.

With reference now to the drawing, in a gate controlled semiconductive device, a semiconductive element 1, the bulk of which is weakly N-type, also includes a P1 layer which is a P-type diffused region, an N1 layer bulk, a P2 layer 2 diffused to a P-type region and a plurality of N2 layers 3 which are N-type diffused regions, spaced, localized surface zones. Metallic layers 4 are provided on each surface of the N2 layers 3. A drain terminal electrode 5 is commonly connected to the all metallic layers 4. A cathode electrode assembly K comprises the metallic layers 4 and the terminal electrode 5.

Two comb-shaped metallic layers 6 and 8 are arranged on a surface of P2 layer 2 which is located around each N2 layers 3. The metallic layer 6 consists of a bridging segment 7a spaced from one end portion of each metallic layer 4 and a plurality of projections 7b extending toward the metallic layers 4. The metallic layer 8 consists of a bridging segment 9a spaced from the other end of each metallic layer 4 and a plurality of relatively thin extensions 9b which are extending from the bridging segment 9a toward the segment 7a along to the N2 layers 3. A terminal electrode 10 is connected to the bridging segment 7a of the metallic layers 6 and a terminal electrode 11 is disposed on the bridging segment 9a of the metallic layer 8. A first gate electrode assembly G1 is comprised of the metallic layer 6 and the terminal electrode 10, and a second gate electrode assembly G2 is formed by the metallic layer 8 and the terminal electrode 11.

As is best shown in FIG. 1, a gate electrode member surrounds the cathode electrode assembly K, and is divided into two sections that are the first electrode assembly G1 and the second electrode assembly G2. A metallic layer 12 is provided on the surface of the P1 layer and a lead 13 is connected to the metallic layer 12.

An anode electrode assembly A is formed by the metallic layer 12 and the lead 13.

A device of the kind described above was made essentially as follows.

First, a weakly N-type silicon wafer was prepared. Next, P1 and P2 layers were grown over each of the end surface of the wafer by diffusing a gallium. After that a cathode layer N2 is formed by diffusing N-type layer in a given depth. Further, an aluminum layer is evaporated to form an ohmic electrode.

In operation, an ON signal is supplied from the first gate electrode assembly G1 and, on the other hand an OFF signal is supplied from the second gate assembly G2. In turning off the semiconductive element 1, the element 1 is swept from both gate electrode assemblies G1 and G2 by means of a diagrammatical connection by the aide of the diode 14 whose anode is connected to the second gate electrode assembly G2 and whose cathode is connected to the first gate electrode assembly G1. Accordingly, when the ON signal is supplied to the cathode electrode assembly K from an external gate terminal G, the gate current flows to a loap which is formed by the first gate electrode G1, the P2 layer 2, the N1 layer, the cathode layer (N2 layer) 3 and the second gate electrode assembly G2. The gate current causes a portion of the N2 layer 3 in the side of the second gate electrode G2 to turn on, and thereafter the main current begins to flow from the anode electrode assembly A to the cathode electrode assembly K. By the flowing of the main current, the conducting region of the N2 layer 3 develops throughout the region of the N2 layer 3 from the second gate electrode assembly side of the N2 layer 3.

Figure 2:
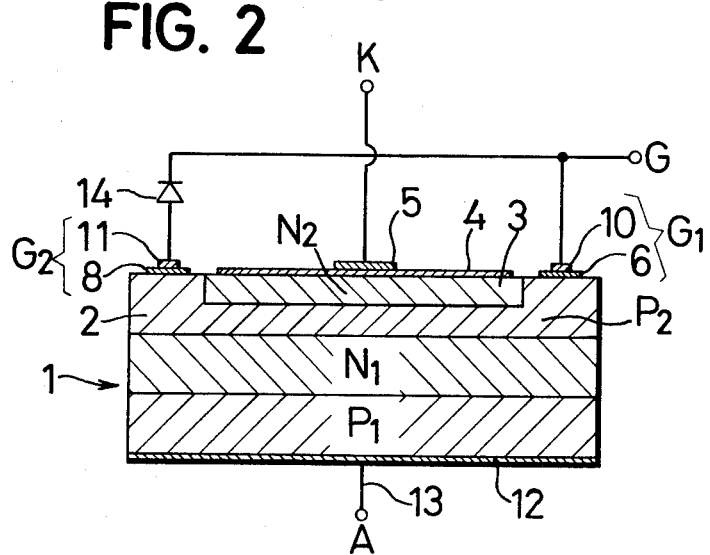
FIG. 2 is a vertical sectional view of the gate controlled semiconductor device taken along line II—II of FIG. 1.

When turning off the main current, the current flows toward the external gate electrode G from the cathode assembly K so as to apply the reverse-bias to the junction formed by the P2 layer 2 and N2 layer 3. In this case, the current flows from the cathode assembly K to the first gate electrode assembly G1 by way of the second gate electrode assembly G2, diode 14, and thereby the portion of the N2 layer 3 opposite to the second gate assembly G2 is turned off. Thereafter, the cathode portion opposite to the first gate electrode assembly G1 is, in turn, returned to an off state. In the device of FIG. 2, when the diode 14 is not connected between the first gate electrode assembly G1 and the second gate electrode assembly G2, the whole region of the N2 layer 3 may be reset to the OFF state by means of sweeping the current individually from gate assemblies G1 and G2.

According to the gate controlled semiconductor device in FIGS. 1 and 2, the gate electrode is divided into two portions, and the firing current is supplied from one of the divided gate electrode to the device. A as a result, the sensitivity of the gate electrode increases, since the opposite length of the cathode electrode to the gate electrodes is shortened. Consequently, the necessary gate current is decreased in the gate turn-off thyristor. Moreover, it should also be evident that the high performance of the gate turn-off thyristor is obtained without decreasing the current capacity.

Figure 3:
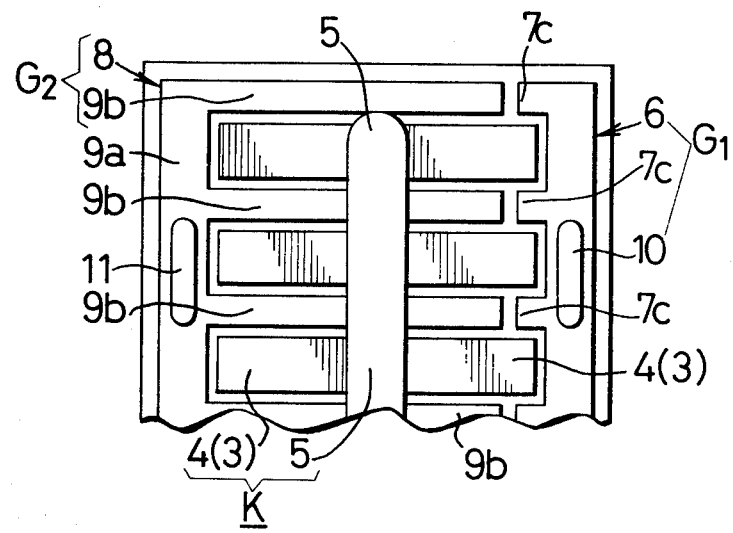
FIG. 3 is a plane view of another gate controlled semiconductor device embodying the present invention.

In FIG. 3 is illustrated a modification of the gate controlled semiconductor device of FIG. 1. In the device of FIG. 3 which is also employed in the present invention, the first gate electrode assembly G1 includes a metallic layer 6 consisting of a bridging segment 7a and a plurality of projections 7c which extend from the bridging segment 7a toward the end portion of the extensions 9b of the metallic 8 forming the second gate electrode assembly G2. Other parts of the device of FIG. 3 are constructed similar to the device of FIG. 1.

Figure 4:
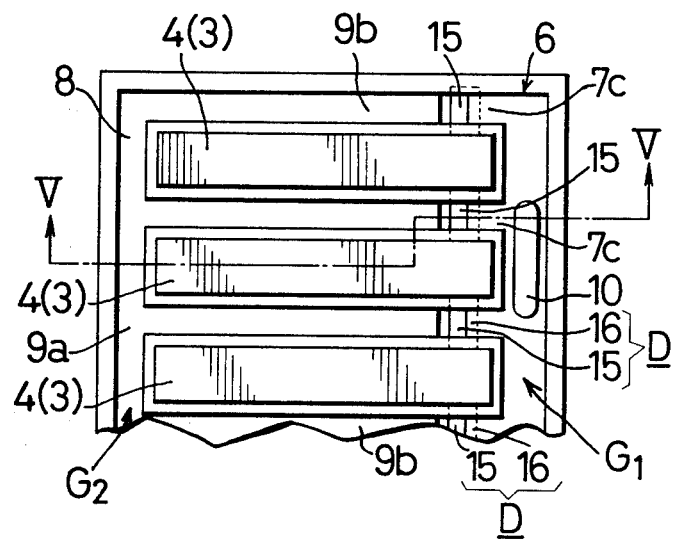
FIG. 4 is a plane view of a modification of the gate controlled semiconductor device of FIG. 3.
Figure 5:
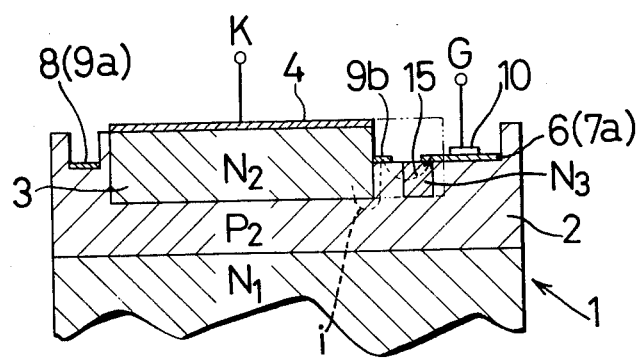
FIG. 5 is a fragmentary vertical sectional view of the gate controlled semiconductor device taken along line V—V of FIG. 4.

FIGS. 4 and 5 illustrate one possible embodiment of this kind in which diode layers D is integrated in the device of FIG. 3. First, the provided N3 layer 15, is diffused in the P2 layer 2 so as to bridge each N2 layer 3. These N2 and N3 layers 3 and 15 are formed by diffusing the impurity simultaneously. The diode layer D is formed by the P1 layer, the N1 layer, P2 layer 2 and N3 layer 15.

As is best shown in FIG. 5, portion 22 is formed on the surface of the P2 layer 2, by a photoetching method in the usual way. The first gate electrode assembly G1 and the second gate electrode assembly G2 are constructed as in the same manner in FIG. 3.

A small capacity gate controlled semiconductor device can be constructed by providing a solder on the cathode (N2) layer 3, by connecting the metallic layer 5 and then dividing the metallic layer 6 from the metallic layer 6. On the other hand, in a large capacity gate controlled semiconductor device, the surface of the P2 layer 2 (to be contacted with the gate electrode) is engraved in a given width. As is best shown in FIG. 5, the surface of the P2 layer 2 surrounding the cathode (N2) layer 3 and the surface of the N3 layer 15 are removed up to the middle depth of the N2 layer 3 by the etching method. The metallic layers 6 and 8 are contacted to the engraved portion of the P2 layer 2.

Figure 6:
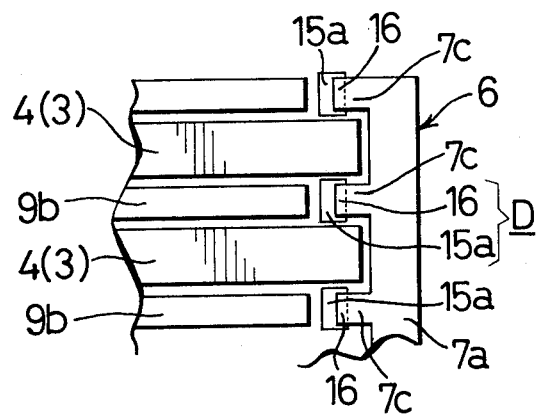
FIG. 6 is a fragmentary plane view of the modification of the gate controlled semiconductor device in FIGS. 4 and 5.

Additionally, in this case, the diode layers D may be formed by forming islands of the N3 layer 15a of N-type and thereafter connecting the metallic layer 6, as shown in FIG. 6.

In the arrangement shown in FIGS. 4 and 5, when the semiconductive element is fired, the gate current is supplied to the N2 layer 3 by way of the metallic layer 6 from the terminal electrode 10, and thereby a part of the N2 layer 3 in the first gate electrode assembly side is fired, then, the whole of the N2 layer 3 is turned ON in the course of time. On the other hand, when the device is turned OFF, the current $i$ flows through a path formed by the cathode layer, the P2 layer 2, the N2 layer 3, the P2 layer 2, the N3 layer 15 and the metallic layer 6, as is shown by a dotted line in FIG. 5. The N3 layers 15 illustrated in FIGS. 5 and 6 perform the same function as the diode 14 employed in FIG. 2. In construction of FIGS. 4 and 5, the N3 layer 15 shortcircuits the metallic layer 6 forming the gate electrode and the N2 layer 3, and a field initiated construction is obtained, since a P2-N2 junction is biased forwardly due to the traverse resistance of the N3 layer 15. In this case, although the sensitivity of the gate decreases more or less, it is, however, not harmful at all in practical use. The device shown in FIG. 6 is used by overlapping an aluminum layers between the N3 layers 15 and the N2 layer 3, and the similar operation is performed as the device of FIG. 2.

Figure 7:
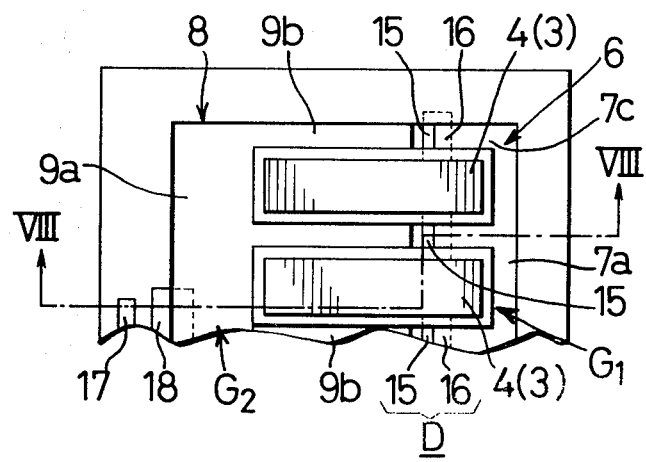
FIG. 7 is a fragmentary plane view of the semiconductor device embodying the present invention.
Figure 8:
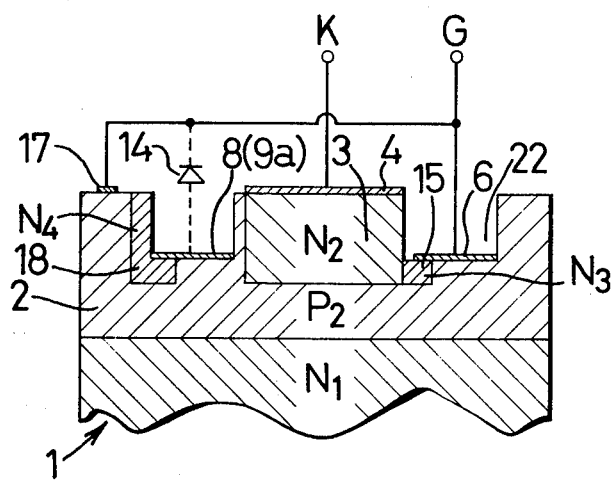
FIG. 8 is a fragmentary vertical sectional view of the gate controlled semiconductor device taken along line VIII—VIII of FIG. 7.

FIGS. 7 and 8 illustrate a gate turn-off thyristor which is also employed in the present invention. The gate turn-off thyristor includes a small area N4 layer 18 which is formed by diffusing N-type impurity on the surface of the P2 layer 2. The N4 layer 18 is arranged into the P2 layer 2 independently with respect to the N2 layer 2. A part of the surface of N4 layer 28 contacts with the metallic layer 8 of the second gate electrode assembly G2. A metallic layer 17 is provided, spaced from the N4 layer 18, on the surface of the P2 layer 2 at the opposite side to the first gate electrode assembly G1 with respect to the N2 layer 3. In this case, an auxiliary thyristor is formed by the P1 layer, N1 layer, P2 layer 2 and the N4 layer 16.

In FIG. 8 the principle of the invention is shown connected diagrammatically. The metallic layer 17 is connected to the external gate terminal G together with the first gate electrode assembly G1. In the device shown in FIG. 8, when the gate current is supplied to the cathode electrode assembly K from the external gate terminal G in the forward biasing condition, the gate current branches to the metallic layer 6 and to the metallic layer 17. The current flows from the metallic layer 6 which makes a part of the cathode layer which is located to the side of the metallic layer 6, serves to fire, and, at the same time, the current from the metallic layer 17 renders the small area auxiliary thyristor consisting of the P1N1P2N4 layers to the ON state. The current from the N4 layer 18 flows into the cathode (N2) layer 3 by way of the second gate electrode assembly G2, and thereafter makes the cathode layer 3 to fire. In this case, the current from the metallic layer 17 is amplified by the auxiliary thyristor. Further, the gate turn-off thyristor shown in FIG. 8, is also turned OFF by the same operation as that of the device shown in FIGS. 4 and 5. When the bridging portions 16 is not provided in the device of FIG. 8, it is necessary to connect the diode 14 between the metallic layers 6 and 8 as shown by a dotted line, or to provide another independent electrode and to apply the reverse bias voltage independently from the metallic layers 6 and 8.

Figure 9:
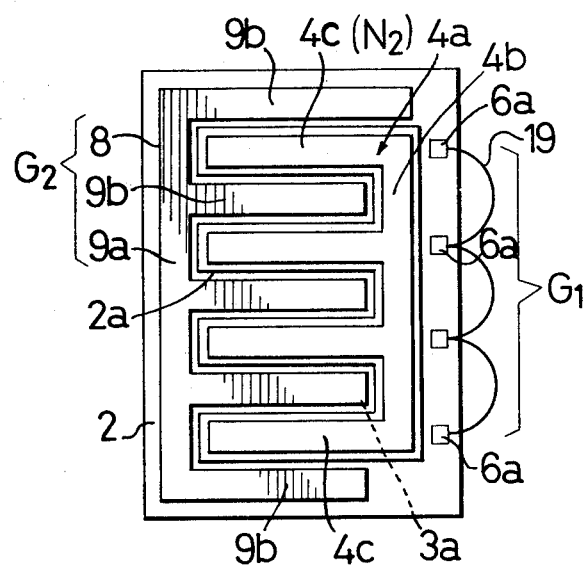
FIG. 9 is a plane view of the gate controlled semiconductor device embodying the present invention.
Figure 10:
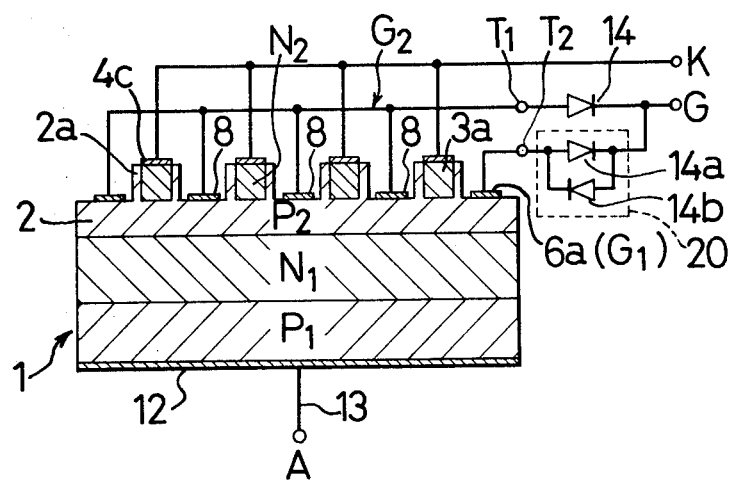
FIG. 10 is a cross sectional view of a gate controlled semiconductor device, showing a principle of the device of FIG. 9.

FIGS. 9 and 10 illustrate another gate controlled semiconductor device embodying the invention, in which the P2 layer 2 has a comb-shaped projecting portion 2a on the surface thereof. A comb-shaped N2 layer 3a is provided in the projecting portion 2a of the P2 layer 2, and, to the surface of the comb-shaped N2 layer 3a is attached a comb-shaped metallic layer 4a, which constructs the cathode electrode assembly on the surface of P2 layer 2 to which is mounted a comb-shaped metallic layer 8 constituting the second gate electrode assembly G2.

A new first gate electrode assembly G1 is provided on the surface of the P2 layer 2. The first gate electrode assembly G1 comprises of a plurality of metallic layers 6a, each of which is adjacent to a bridging portion 4b of the cathode electrode assembly K, and each of which is spaced equidistantly from each other, while a lead 19 is connected serially and electrically to the metallic layers 6a. The opposite lengths of each metallic layer 6a of the first gate electrode assembly G1 with respect to the cathode electrode K is set to short so as to obtain the same gate current as that of the usual three-terminal thyristor in comparison to the opposite lengths between each of the extensions 9b and extensions 4c of the metallic layer 4a.

In particular, FIG. 10 shows an electrical connection of the device, and the second gate assembly G2 is connected serially to the diode 14, and on the other hand, the first gate electrode assembly G1 is connected serially to a rectifier 20 having a reverse and parallel connection with diodes 14a and 14b. The cathode electrode K, the external gate terminal G and the anode assembly A form a three-terminal gate turn-off thyristor.

In the construction described above, the device operates as follows. When the forward-bias voltage is applied between the anode electrode A and the cathode electrode K, the gate current flows into the first gate electrode assembly G1 and due to the application of forward bias from the external gate terminal G by the aide of the rectifier 20, the element 1 is turned ON. When the element 1 becomes conductive, the anode current is drawn from the external gate terminal G, and thereby the main current is interrupted. In this case, the second gate electrode G2 mainly acts to interrupt the main current. The diodes 14a and 14b serve to keep the balance of impedance to the diode 14.

Additionally, the arrangement of FIG. 10 may be used as a four-terminal gate turn-off thyristor, by using the cathode electrode assembly K, terminals T1 and T2 and the anode electrode assembly A. The four-terminal gate turn-off thyristor can be widely used to a high frequency operated gate turn-off thyristor and to enhance the di/dt capacity in case the conductive element 1 lacks of the di/dt capacity. Once the gate turn-off thyristor is turned on, the small current continues to flow to the cathode electrode assembly K to prevent the localization of the current in a part of the cathode electrode assembly K.

Figure 11:
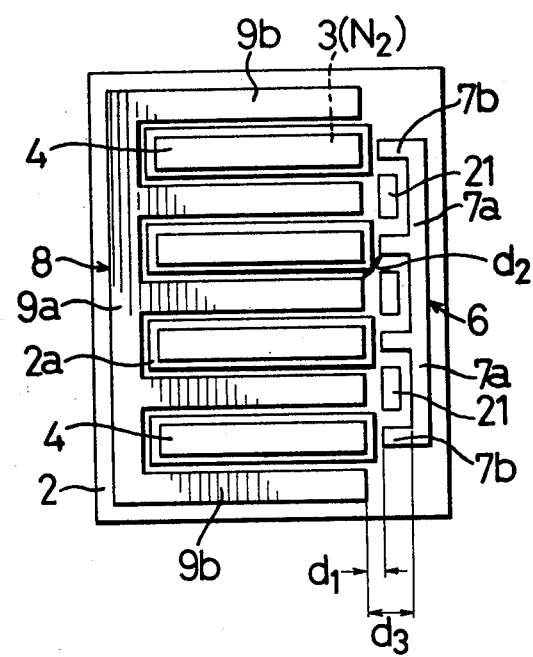
FIG. 11 is a plane view of a modification of the gate controlled semiconductor device in FIG. 9.

FIG. 11 shows a further embodiment of the invention, and a relatively narrow and relatively long rectangular N-type island 3 is provided on the surface of the P2 layer 2a the comb-shaped metallic layer 4 is mounted on the surface of the P2 layer. Another comb-shaped metallic layer 6 is provided on the other side of the P2 layer, and the metallic layer 6 comprises of plural projections 7b extending towards the edge of the metallic layer 3 of the cathode electrode assembly K. Plural high resistance resistor layers 21 are provided on the surface of P2 layer, each of which is spaced, localized between the projection 9b and the metallic layer 6. The high resistance resistor layers 21 acts to prevent the current from flowing from the first gate electrode assembly G1 to the second gate electrode assembly G2, and thereby the separated cathode-type gate turn-off thyristor is formed. And the second gate electrode assembly G2 is separated at distance d1. The distance between the projection 7b and the adjacent extension 9b of the metallic layer 8 is separated by a distance d2, and further one of the end portion of the metallic layer 4 is separated from the bringing segment 7a of the first gate electrode assembly, as shown in FIG. 11. When $d1 < < d2$, $d3$, the high resistance resistor layer 21 is unnecessary, in the embodiment the resistor layer 21 is provided in order to use the wafer effectively.

When the dividing number of the cathode electrode assembly K is $n$ and the length of the projections is $d$, the effective opposing length of the extensions 9b may be smaller than that between the second gate electrode assembly G2 and the metallic layers 4.

Figure 12:
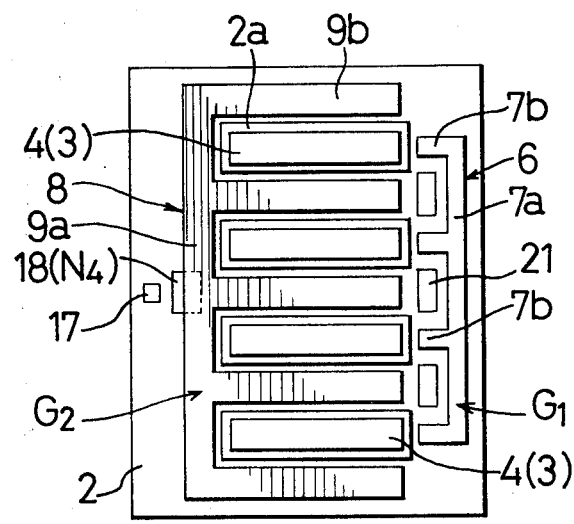
FIG. 12 is a plane view of another gate controlled semiconductor device which is another embodiment of the invention.
Figure 13:
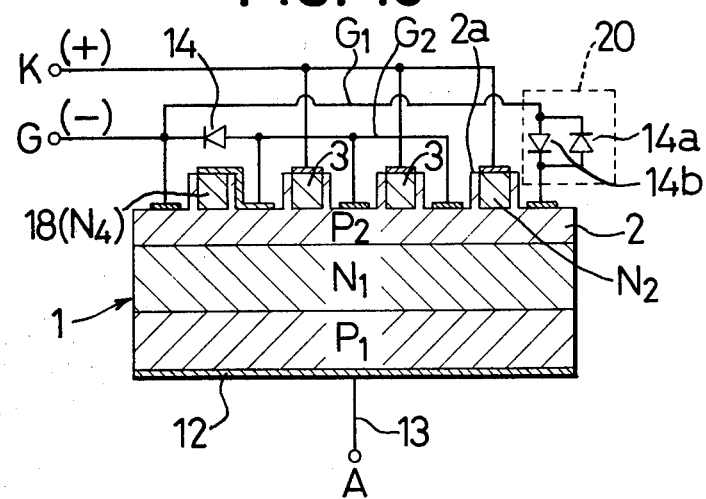
FIG. 13 is a vertical sectional view of a gate controlled semiconductor device, showing a principle of FIG. 12.

FIGS. 12 and 13 area a modification of the device of FIG. 11, which are also embodying the present invention. A N4 layer 18 if formed in the P2 layer 2a projecting from the surface of the P2 layer 2. The N4 layer 18 forms a cathode-emitter layer of the auxiliary thyristor, and is bridged by the metallic layer 8. The metallic layer 17 is also contacted with the P2 layer 2 adjacent to the N4 layer 18.

In FIG. 13 the principles of the gate turn-off thyristor in FIG. 12 are shown, in which a diode 14 is connected, in common, between the metallic layer 17 and the second gate electrode G2. A rectifier 20 is connected, in common, between the metallic layer 17 and the first gate electrode assembly G1. The first gate electrode assembly G1 is further connected to the external gate terminal G in common with the second gate electrode assembly G2.

In the gate turn-off thyristor constructed as described above, employed as external terminals are the cathode electrode assembly K, the external gate terminal G and the anode electrode assembly A.

In operations, when the gate turn-off thyristor is turned off, the positive bias voltage is applied to the cathode electrode assembly K, and the negative bias voltage is applied to the external gate terminal G. Thereby the gate current is branched to the N3 layer 3 and the anode electrode assembly A. The current from the metallic layer 17 causes the auxiliary thyristor constituted by the P1, N2, P2 and N4 layers to fire, and the current is amplified. The amplified current flows through the second gate electrode assembly G2 and causes the main thyristor formed by the P1, N1, P2 and N3 layers to fire. On the other hand, the branched current toward the N2 layer 3 makes the other end portion of the cathode N2 layer 3 to become conductive.

An amplifying operation of the auxiliary thyristor is stopped when the gate turn-off thyristor becomes conductive; therefore the gate current is supplied from the first gate electrode assembly G1 in order to dissolve a harmful influence caused by an interruption of the main current due to oscillation of the load current and due to the holding current in a part of the cathode layer. In this case, the gate current may be excusable at a small current similar to the gate current required in the usual thyristor, because the opposite length of the first gate electrode assembly G1 and the cathode electrode assembly K is fully short than that of the second gate electrode assembly G2 and the cathode electrode assembly K.

Figure 14:
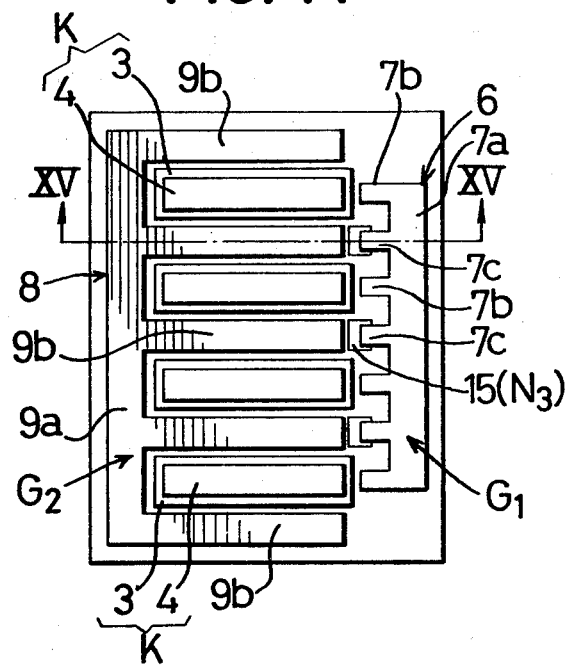
FIG. 14 is a fragmentary plane view of a gate controlled semiconductor device modifying the device of FIG. 12.
Figure 15:
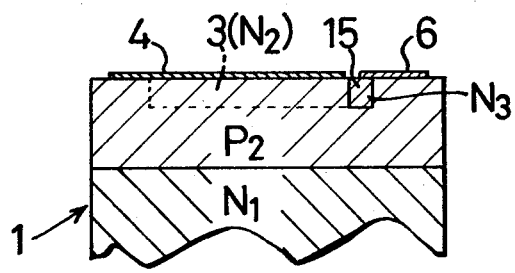
FIG. 15 is a fragmentary vertical sectional view of the gate controlled device showing a principle of FIG. 14.

FIGS. 14 and 15 illustrate a modifying form of the gate turn-off thyristor of FIG. 11, which includes diode layer D instead of the resistor layer 21. In the device of FIGS. 14 and 15, the metallic layer 6 of the first gate electrode assembly G has the projections toward the cathode layer and a plurality of projection 7c, each of which extends toward the end portion and is spaced and localized to each adjacent projection 7b. N3 layers 15 are formed in the P2 layer 2 between the end portion of the extensions 9b of the metallic layer 8 and the projections 7c of the metallic layer 6 so as to be bridged by the projection 7c.

Figure 16:
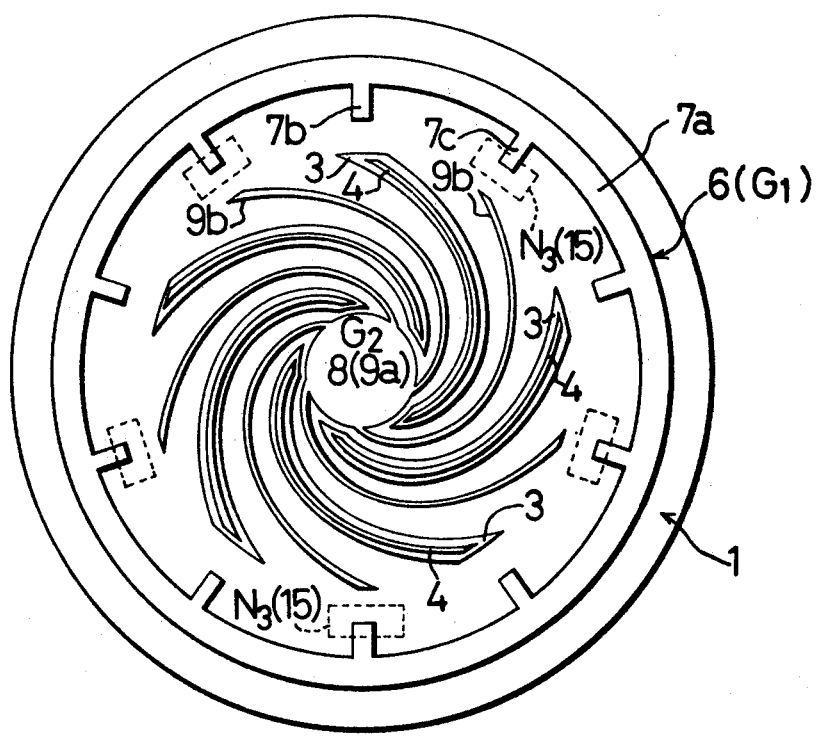
FIG. 16 is a plane view of another gate controlled semiconductor device embodying the invention.

FIG. 16 illustrates a gated controlled semiconductor device which is the most applicable to a large power capacity switching device. In the device of FIG. 16, the semiconductive element 1 is constructed by a disc shaped wafer, and a plurality of radial and spiral N2 layer 3 is provided in the P2 layer 2 spaced apart from each other. Each radial and spiral metallic layer 4 is mounted on each N2 layer 3. A ring-shaped metallic layer 6 is mounted on the surface of the P2 layer, and a metallic layer 8 is mounted on the center portion of the surface of the P2 layer. The metallic layer 6 has a plurality of projections 7b and a plurality of projections 7c each of which projects toward the center portion of the surface of the element 1 from the bridging segment 7a. The metallic layer 8 has a plurality of radial and spiral extensions 9b extending toward the projections 7b, respectively, from the bridging segment 8a.

In the device constructed above, diode layers D consisting of an N3 layer 15 may be also provided between the projections 7c and the end portions of the extensions 9b as is best shown by a dotted line.

Figure 17:
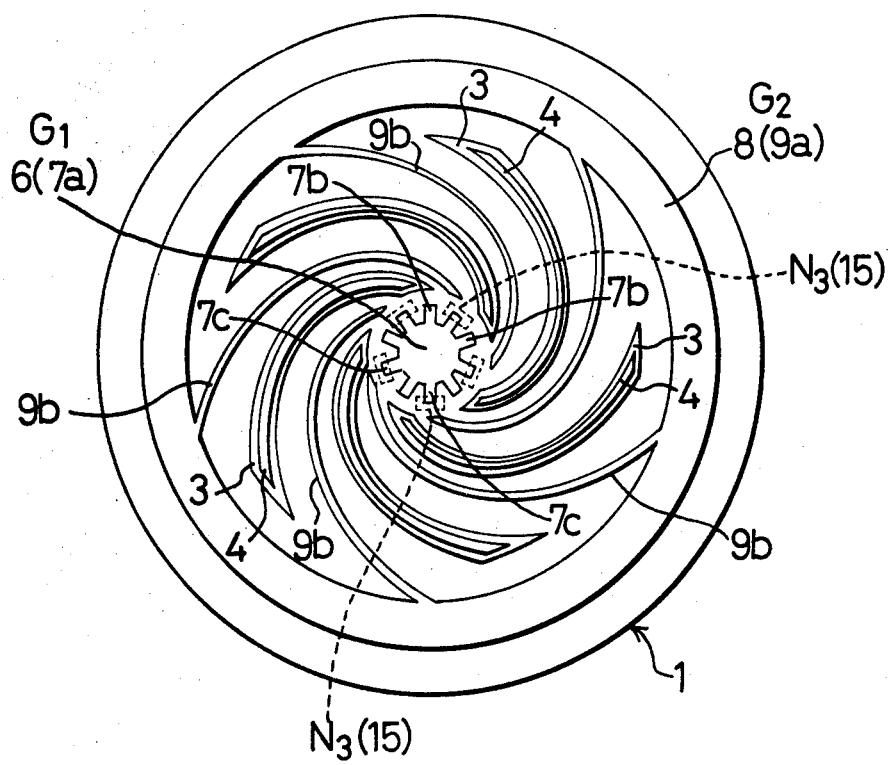
FIG. 17 is a plane view of a modification of the device of FIG. 16.

FIG. 17 shows a modification of the semiconductor device of FIG. 16, and, in the device of FIG. 17, the first gate electrode assembly G1 is provided in the center portion of the surface of the element 1 and the second gate electrode assembly G2 is provided at the outer side of the first gate electrode assembly G1. The first gate electrode assembly G1 includes a metallic layer 6 mounted on the center surface portion of the p2 layer. The metallic layer 6 consists of a circular-shaped bridging segment 7a, a plurality of projections 7b and a plurality of projections 7c projecting radially from the bridging segment 7a. The second gate electrode assembly G2 includes a ring-shaped metallic layer 8 which is mounted on the surface of the P2 layer. The metallic layer 8 consists of a ring-shaped bridging segment 9a and a plurality of spiral extensions 9b extending from the bridging segment 9a toward the projections 7b of the metallic layer 6. In the device of FIG. 17, N3 layers 15 may be, also, provided with the P2 layer located between the end portion of the extension 9b and the projections 7b so as to bridge them.

As is explained with reference to the above various embodiments, in the gate controlled semiconductor device in accordance with the present invention, a gate electrode is substantially a plurality of gate electrode assemblies, and at least one gate electrode assembly for supplying the ON signal is provided so as to oppose to the cathode electrode.

Accordingly, it should be apparent that following advantages are obtained. (1) An ON sensitivity of the device is extremely improved in comparison with the prior art device. (2) It is easy to prevent the malfunction of the device by supplying continuously the small gate current from the first gate assembly in conducting interval thereof, even when a load circuit is unsteady due to an oscillatory load or the like. (3) A gate turn-off thyristor obtained by the present invention is inexpensive and widely applicable to a high-frequency load and to a high transient current load by forming a four-terminal gate turn-off thyristor in comparison with a conventional gate turn-off thyristor. (4) A good characteristic and economical gate turn-off thyristor can be obtained by dividing a gate electrode to exclusive gate electrodes using for turn-on and turn-off. (5) Since the additional and mechanical parts are not required in addition to a conventional gate controlled semiconductor device, an inexpensive device is obtained without decreasing a yield. (6) Since the decrement of the junction area is not necessary, a high performance device is obtained without decreasing its current capacity.

Accordingly, it is to be understood that the embodiments described in detail are only illustrative of the general principles involved; other embodiments may be devised consistent with the spirit and scope of the invention.

What is claimed is:

1. A gate controlled semiconductor device comprising a semiconductive element having at least two P-N junctions formed between a P-type diffused region and an N-type diffused region on a disc-shaped wafer a cathode electrode divided into a plurality of cathode electrode assemblies, each assembly including a radial and spiral-shaped metallic layer on a radial and spiral-shaped cathode-emitter layer formed on a surface of said semiconductive element, an anode electrode, and a gate electrode including a plurality of separated gate electrode assemblies on the surface of said semiconductive element so as to surround said cathode electrode, said plurality of gate electrode assemblies comprising a first gate electrode assembly having a plurality of projections opposite to said cathode electrode assemblies and a second gate electrode assembly in the opposite side with respect to said first gate electrode assembly and opposite to said plurality of cathode electrode assemblies so that the facing length of the second gate electrode assembly is longer than the facing length of the first electrode assembly to said plurality of cathode electrode assemblies.

2. A gate controlled semiconductor device as claimed in claim 1, wherein said first gate electrode assembly comprises a metallic layer in the center portion of the surface of the semiconductive element and said second gate electrode assembly comprises a ring-shaped metallic layer mounted on the outer side surface of said semiconductive element.

3. A gate controlled semiconductor device as claimed in claim 1, wherein said first gate electrode assembly comprises a metallic layer at the center portion of the surface of said semiconductive element and consisting of a circular-shaped bridging segment and a plurality of projections projecting radially from the bridging segment, said second gate electrode assembly comprising a ring-shaped metallic layer arranged at the side of said metallic layer of the first gate electrode assembly and including a ringshaped bridging segment and a plurality of spiral extensions extending from the bridging segment toward the projections of said first gate electrode assembly.

4. A gate controlled semiconductor device as claimed in claim 1, further comprising blocking means for blocking the current flowing to said second gate electrode assembly in turning on said semiconductive element by means of a signal to said plurality of gate electrode assemblies.

5. A gate controlled semiconductor device as claimed in claim 4, said blocking means including a diode layer having an N-type layer integrated in the P-type layer so as to bridge each cathode-emitter layer and said first gate electrode assembly. 9

6. A gate controlled semiconductor device as claimed in claim 5, said blocking means including a plurality of diode layers having N-type layer islands formed on the surface of a P-type layer, so as to be contacted with the projections of the first gate electrode assembly and so as to be spaced from the cathode-emitter layer and extensions of the second gate electrode assembly.

7. A gate controlled semiconductor device as claimed in claim 5, further comprising an auxiliary thyristor layer including an N-type layer diffused on the surface of the P-type layer of the semiconductive element for contacting the metallic layer of said second gate electrode assembly and a metallic layer on said P-type layer, spaced from said N-type layer.

8. A gate controlled semiconductor device as claimed in claim 1, wherein said metallic layer of the first gate electrode assembly further comprises a plurality of projections projecting toward the end portion of the extensions of the metallic layer forming the second gate electrode assembly.

9. A gate controlled semiconductor device as claimed in claim 8, further comprising a plurality of diode layers including an N-type region diffused on the surface of the P-type region so as to be contacted with said projections of the first gate electrode assembly and to be spaced apart from said end portion of the extensions of the metallic layer constituting the second gate electrode assembly.

10. A gate controlled semiconductor device as claimed in claim 9, further comprising an auxiliary thyristor layer including an N-type layer diffused on the surface of the P-type layer of the semiconductive element so as to contact with the metallic layer of said second gate electrode assembly and an external diode connected between said metallic layer of the second gate electrode assembly and the metallic layer of the first gate electrode assembly.

11. A gate controlled semiconductor device as claimed in claim 4, wherein said blocking means comprises an external diode connected between the second gate electrode assembly and an external gate terminal and an external rectifier comprising a pair of parallel and reversibly connected diodes connecting the first gate electrode assembly and said external gate terminal.

12. A gate controlled semiconductor device as claimed in claim 1, wherein a four-terminals gate turn-off thyristor is formed by external terminals each of which is applied to said first and second gate electrode assemblies cathode electrode assembly and an anode electrode assembly.

13. A gate controlled semiconductor device as claimed in claim 1, further comprising a resistor layer formed in the P-type layer and located between a metallic layer of first gate electrode and an extension of metallic layer forming the second gate electrode assembly.

14. A gate controlled semiconductor device as claimed in claim 4, wherein said blocking means has an external diode connected between the first gate electrode assembly and the second gate electrode assembly, and an anode electrode on said diode is connected to said second gate electrode assembly and a cathode electrode on said diode is connected to said first gate electrode assembly.

15. A gate controlled semiconductor device as claimed in claim 1, comprising a semiconductive element having a portion of a P-type region and in said projecting portion, a cathode electrode assembly having a metallic layer mounted on said N-type region, a second gate electrode assembly having a metallic layer interconnecting with said projecting portion of the P-type region and further a first gate electrode assembly having a plurality of small area metallic layers on the surface of said P-type region adjacent to said projecting portion and spaced equidistantly from each other, and a lead connecting said each small area of metallic layer of the first gate electrode assembly.

16. A semiconductor device as defined in claim 1, wherein said device is switched to the OFF state by sweeping current by cathode regions, the second gate electrode assembly, the diode and the first gate electrode assembly and eliminating gate current for maintaining the ON state of the device.

* * * * *